(12) United States Patent
Ha et al.

(10) Patent No.: US 7,359,256 B2
(45) Date of Patent: Apr. 15, 2008

(54) SEMICONDUCTOR MEMORY DEVICE

(75) Inventors: Sung-Joo Ha, Ichon (KR); Ho-Youb Cho, Ichon (KR)

(73) Assignee: Hynix Semiconductor, Inc., Kyoungki-Do (KR)

( * ) Notice: Subject to any disclaimer, the term of this patent is extended or adjusted under 35 U.S.C. 154(b) by 0 days.

(21) Appl. No.: 11/312,610

(22) Filed: Dec. 21, 2005

(65) Prior Publication Data
US 2007/0002672 A1    Jan. 4, 2007

(30) Foreign Application Priority Data
Jun. 30, 2005    (KR) .................. 10-2005-0058716

(51) Int. Cl.
*G11C 7/00*    (2006.01)
(52) U.S. Cl. .................. 365/191; 365/230.06
(58) Field of Classification Search ................ 365/191, 365/230.06
See application file for complete search history.

(56) References Cited

U.S. PATENT DOCUMENTS

| | | | |
|---|---|---|---|
| 5,867,446 A | 2/1999 | Konishi et al. | |
| 6,208,582 B1 * | 3/2001 | Kanda et al. | 365/233 |
| 7,136,312 B2 * | 11/2006 | Fujimoto et al. | 365/191 |
| 7,161,860 B2 * | 1/2007 | Ha et al. | 365/203 |
| 2003/0048680 A1 | 3/2003 | Ooishi et al. | |

FOREIGN PATENT DOCUMENTS

| | | |
|---|---|---|
| JP | 2000-078858 | 3/2000 |
| JP | 2000-260197 | 9/2000 |
| JP | 2001-126470 | 5/2001 |

* cited by examiner

*Primary Examiner*—Amir Zarabian
*Assistant Examiner*—Anthan T Tran
(74) *Attorney, Agent, or Firm*—McDermott Will & Emery LLP

(57) ABSTRACT

Disclosed herein is a semiconductor memory device for reducing a current consumption used for operating a write command or a read command. The semiconductor memory device includes a global data latch unit for latching a global data loaded on a global data line in response to a first write enable signal to thereby generate a global latch data; a local data write driving unit for receiving the global latch data to output a local data to a local data line in response to a second write enable signal; and a write driver control unit for generating the first write enable signal and the second write enable signal to inactivate the first write enable signal when a write operation is not performed.

13 Claims, 6 Drawing Sheets

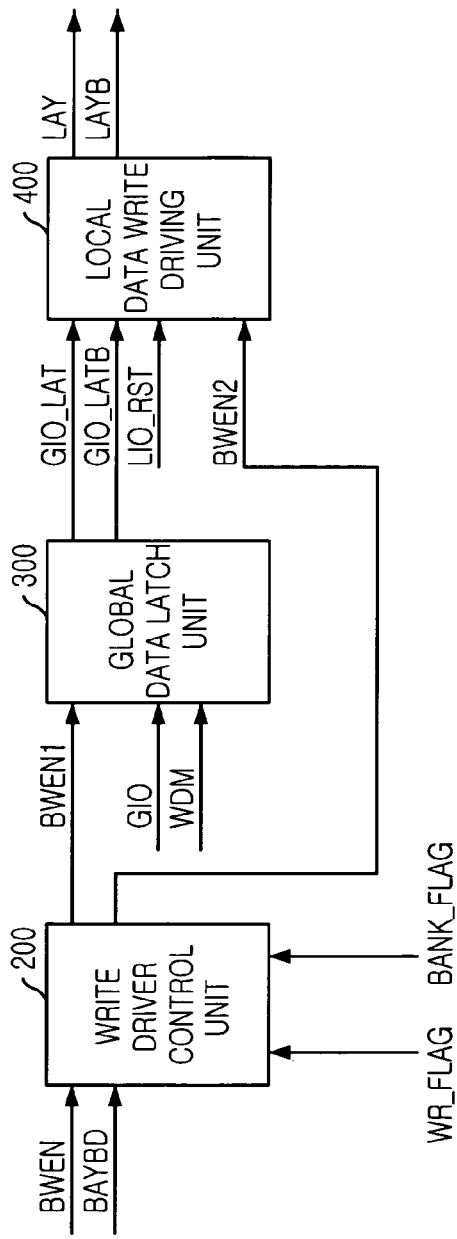
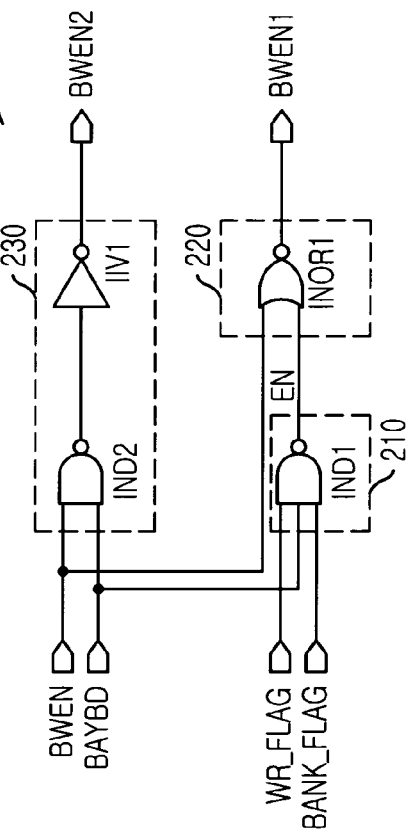

SEMICONDUCTOR MEMORY DEVICE

FIELD OF THE INVENTION

The present invention relates to a semiconductor memory device; and, more particularly, to a semiconductor memory device for reducing a current consumption used for performing an operation based on a write command or a read command.

DESCRIPTION OF RELATED ARTS

Recently, a semiconductor memory device has about four banks, each for independently performing a write operation and a read operation.

To perform the write operation and the read operation, each bank includes a row decider for decoding a row address, a column decider for decoding a column address, and a control circuit unit for controlling the read operation and the write operation of the bank.

FIG. 1 is a block diagram showing a conventional semiconductor memory device. More particularly, FIG. 1 shows a circuit block provided with a bank to perform a write operation.

As shown, the semiconductor memory device includes a write driver control unit 10, a global data latch unit 20 and a local data write driving unit 30.

The write driver control unit 10 receives a write control signal BWEN and a driver select signal BAYBD to thereby generate a first write enable signal BWEN1 and a second write enable signal BWEN2. Herein, the write control signal BWEN having a pulse shape drives a selected write driver in each bank. The driver select signal BAYBD enables the selected write driver in an X4 mode or an X8 mode. Herein, the X4 mode or the X8 mode indicates a number of data inputted or outputted once for a write operation or a read operation when the semiconductor memory device operates. Namely, the X8 mode means that eight data are inputted or outputted once for a write operation or a read operation. Hence, in the X8 mode, the semiconductor memory device enables eight write drivers selected from a plurality of write drivers in the bank to perform the write operation or the read operation.

The global data latch unit 20 receives the first write enable signal BWEN1, a global data GIO and a data mask signal WDM to generate a first global latch data GIO_LAT and a second global latch data GIO_LATB. In detail, the global data latch unit 20 latches the global data GIO on a global data line in response to the first write enable signal BWEN1. If the data mask signal WDM is activated, the global data latch unit 20 stops latching so as not to maintain the global data GIO.

The local data write driving unit 30 receives a local reset signal LIO_RST, the first global latch data GIO_LAT and the second global latch data GIO_LATB outputted from the global data latch unit 20 to generate a first local data LAY and a second local data LAYB to a local data line. In detail, the local data write driving unit 30 latches the first global latch data GIO_LAT and the second global latch data GIO_LATB in response to the second write enable signal BWEN2. Herein, the local reset signal LIO_RST is for a reset operation by making a potential of the first local data LAY on the local data line be equalized the second local data LAYB in case that the local data are not saved.

FIG. 2 is a detailed circuit diagram describing the conventional semiconductor memory device of FIG. 1.

As shown, first, the write driver control unit 10 includes a NAND gate ND1 and a first inverter 11.

The NAND gate ND1 receives the write control signal BWEN and the driver select signal BAYBD to perform a NAND operation. As a result, The NAND gate ND1 generates the first write enable signal BWEN1. The first inverter 11 inverts the first write enable signal BWEN1 in order to generate the second write enable signal BWEN2.

The global data latch unit 20 includes a second inverter I2, a third inverter I3, a first latch unit 21 and a second latch unit 22.

The second inverter I2 inverts the global data GIO to thereby generate an inverted global data GIOB and the third inverter I3 inverts the data mask signal WDM for generating an inverted data mask signal WDMB.

The first latch unit 21 includes a first PMOS transistor MP1, a second PMOS transistor MP2, a first NMOS transistor MN1, a second NMOS transistor MN2, a third NMOS transistor MN3 and a first buffer constituting a fourth inverter I4 and a fifth inverter I5. The first latch unit 21 receives the inverted global data GIOB and outputs the second global latch data GIO_LATB in response to the first write enable signal BWEN1.

The second latch unit 22 includes a third PMOS transistor MP3, a fourth PMOS transistor MP4, a fourth NMOS transistor MN4, a fifth NMOS transistor MN5, a sixth NMOS transistor MN6 and a second buffer constituting a sixth inverter I6 and a seventh inverter I7. The second latch unit 22 receives the global data GIO and outputs the first global latch data GIO_LAT in response to the first write enable signal BWEN1.

In the global data latch unit 20, if the data mask signal WDM is activated, the global data latch unit 20 stops a latching operation so as not to maintain the global data GIO.

The local data write driving unit 30 includes an eighth inverter I8, a first output unit 31, a second output unit 32 and a precharge unit 33.

The eighth inverter I8 inverts the local reset signal LIO_RST in order to generate an inverted local reset signal LIO_RSTB.

The first output unit 31 includes a fifth PMOS transistor MP5, a sixth PMOS transistor MP6, a seventh NMOS transistor MN7, a eighth NMOS transistor MN8, a ninth NMOS transistor MN9, a third buffer having a ninth inverter I9 and a tenth inverter I10, and a eleventh inverter I11. Hence, the first output unit 31 performs a latching operation for keeping the second global latch data GIO_LATB in response to the second write enable signal BWEN2.

The second output unit 32 includes a seventh PMOS transistor MP7, a eighth PMOS transistor MP8, a tenth NMOS transistor MN10, a eleventh NMOS transistor MN11, a twelfth NMOS transistor MN12, a fourth buffer constituting a twelfth inverter I12 and a thirteenth inverter I13, and a fourteenth inverter I14. Hence, the second output unit 32 performs latching the first global latch data GIO_LAT in response to the second write enable signal BWEN2.

The precharge unit 33 includes a ninth PMOS transistor MP9, a tenth PMOS transistor MP10 and an eleventh PMOS transistor MP11.

FIG. 3 is a timing diagram illustrating an operation of the conventional semiconductor memory device of FIGS. 1 and 2.

Hereinafter, referring to FIGS. 1 to 3, an operation of the conventional semiconductor memory device will be explained in detail.

First, the driver select signal BAYBD having a logic level 'HIGH' is inputted to enable the selected write driver of the bank in the X4 mode or the X8 mode. The write control signal BWEN having a logic level 'HIGH' is inputted to enable the bank for performing the write operation.

Continuously, based on the driver select signal BAYBD and the write control signal BWEN, the write driver control unit 10 generates the first write enable signal BWEN1 having a logic level 'LOW' and the second write enable signal BWEN2 having a logic level 'HIGH' by inverting the first write enable signal BWEN1.

Except for a period when the first write enable signal BWEN1 is the logic level 'LOW', the global data latch unit 20 maintains an enable state so as to latch the global data GIO on the global data line. Accordingly, as shown in FIG. 3, the global data latch unit 20 can latch the global data GIO in response to the first write enable signal BWEN1 generated from the write control signal BWEN. As a result, the first global latch data GIO_LAT and the second global latch data GIO_LAT2 are outputted.

The local data write driving unit 30 latches the first global latch data GIO_LAT and the second global latch data GIO_LATB outputted from the global data latch unit 20 in response to the second write enable signal BWEN2. As a result, the first local data LAY and the second local data LAYB are outputted to the local data line and then saved at a predetermined unit cell through a bitline sense amplifier.

In the mean time, the semiconductor memory device partially shares the global data line on which the global data GIO is transferred according to the read command or the write command. However, as described above, in case that the global data latch unit 20 maintains the enable state except for the period when the first write enable signal BWEN1 is the logic level 'LOW', the global data GIO on the global data line is latched in response to the read command after the write command. As a result, a problem that the global data GIO latched by the read command is transferred to the local data write driving unit 30 has been arisen.

Namely, as shown in FIG. 3, a 'Read Data 1' and a 'Read Data 2' on the global data line should be outputted to external according to the read command. However, because the global data latch unit 20 is in the enable state (see 'A'), the global data latch unit 20 latches the 'Read Data 1' and the 'Read Data 2' so that the 'Read Data 1' and the 'Read Data 2' are transferred to the local data write driving unit 30 (see 'B').

Accordingly, an unnecessary current is consumed because the read data on the global data line is latched for a read operation. Moreover, since a large number of global data latch units are provided with the bank, much more current consumption is occurred.

SUMMARY OF THE INVENTION

It is, therefore, an object of the present invention to provide a semiconductor memory device for reducing a current consumption during an operation in response to a write command or a read command by removing an unnecessary operation for latching a global data on a global data line according to the read command.

In accordance with an aspect of the present invention, there is provided a semiconductor memory device including a global data latch unit for latching a global data loaded on a global data line in response to a first write enable signal to thereby generate a global latch data; a local data write driving unit for receiving the global latch data to output a local data to a local data line in response to a second write enable signal; and a write driver control unit for generating the first write enable signal and the second write enable signal to inactivate the first write enable signal when a write operation is not performed.

In accordance with another aspect of the present invention, there is provided a method for reducing a current consumption of the semiconductor memory device, comprising the steps of: generating a first write enable signal and a second write enable signal; latching a global data loaded on a global data line in response to the first write enable signal to generate a global latch data; and outputting a local data to a local data line based on the global latch data in response to the second write enable signal, wherein the first write enable signal is inactivated when a write operation is not performed.

In accordance with further another aspect of the present invention, there is provided a method for reducing a current consumption of the semiconductor memory device, comprising the steps of: generating a first write enable signal, a second write enable signal and a final data mask signal; latching a global data loaded on a global data line in response to the first write enable signal and the data mask signal to generate a global latch data; and outputting a local data to a local data line based on the global latch data in response to the second write enable signal, wherein the global data is not latched when the final data mask signal is activated.

BRIEF DESCRIPTION OF THE DRAWINGS

The above and other objects and features of the present invention will become better understood with respect to the following description of the specific embodiments given in conjunction with the accompanying drawings, in which:

FIG. 4 is a block diagram depicting a semiconductor memory device in accordance with an embodiment of the present invention;

FIG. 5 is a circuit diagram showing a write driver control unit of the semiconductor memory device in FIG. 4;

DETAILED DESCRIPTION OF THE INVENTION

Figure 1:
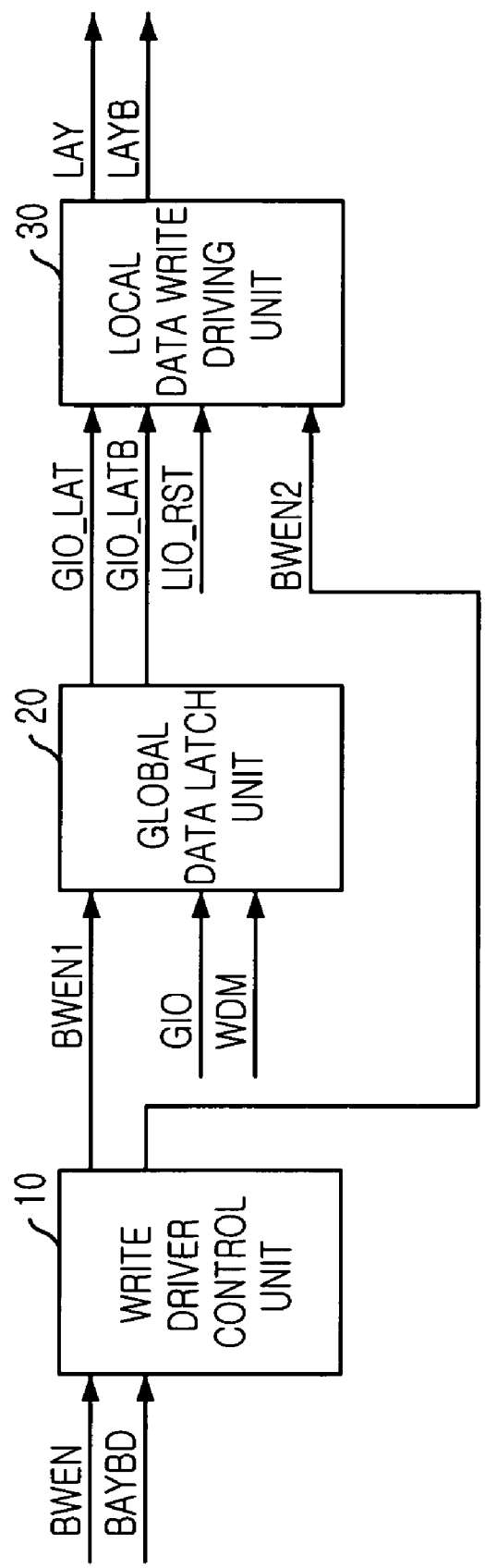
FIG. 1 is a block diagram showing a conventional semiconductor memory device.
Figure 2:
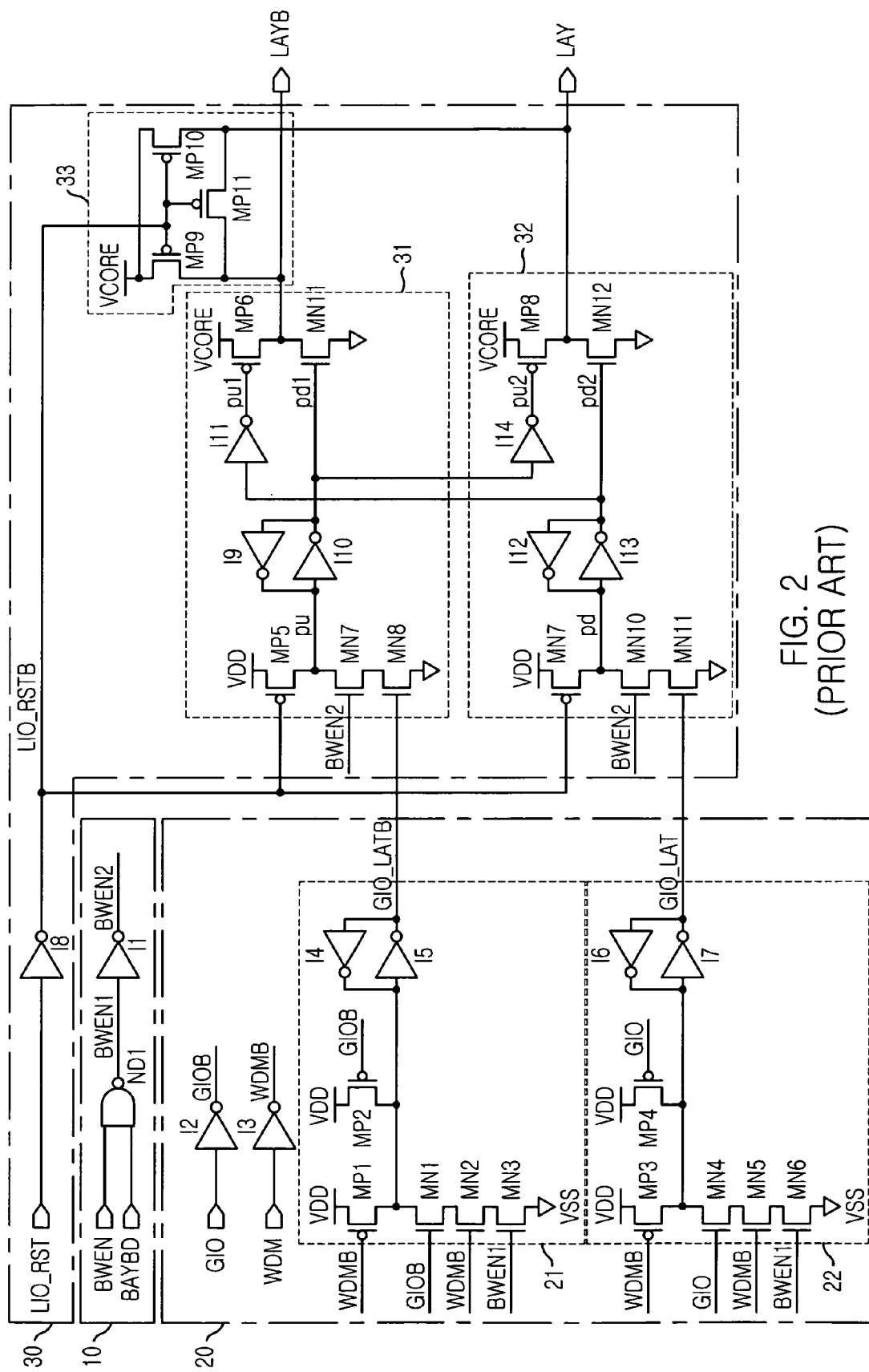
FIG. 2 is a detailed circuit diagram describing the conventional semiconductor memory device of FIG. 1.
Figure 3:
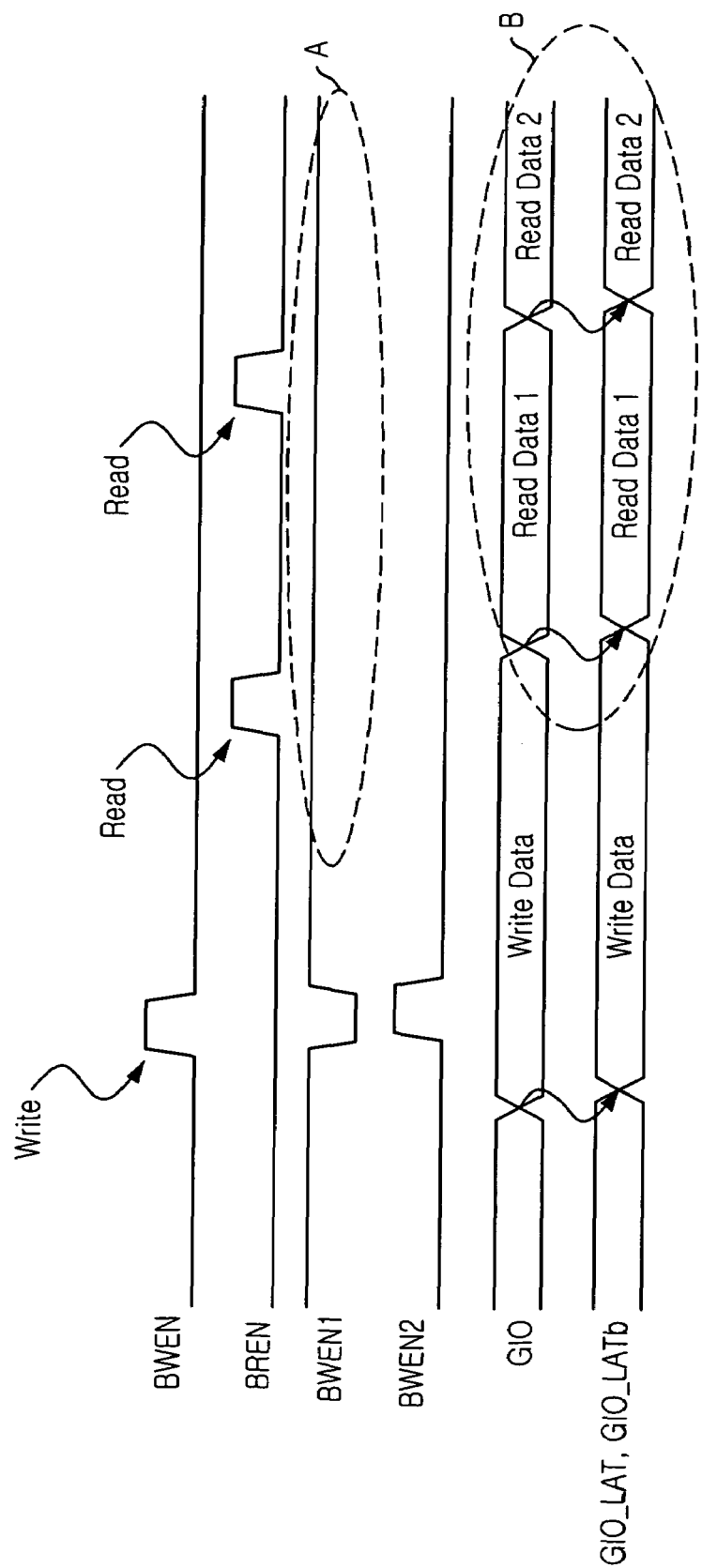
FIG. 3 is a timing diagram illustrating an operation of the conventional semiconductor memory device of FIGS. 1 and 2.

Hereinafter, a semiconductor memory device in accordance with the present invention will be described in detail referring to the accompanying drawings.

FIG. 4 is a block diagram depicting a semiconductor memory device in accordance with an embodiment of the present invention.

As shown, the semiconductor memory device includes a write driver control unit 200, a global data latch unit 300 and a local data write driving unit 400.

The global data latch unit 300 latches a global data GIO loaded on a global data line in response to a first write enable signal BWEN1 and outputs a first global latch data GIO_LAT and a second global latch data GIO_LATB.

The local data write driving unit 400 receives the first global latch data GIO_LAT and the second global latch data GIP_LATB, which are outputted from the global data latch unit 300, and outputs a first local data LAY and a second local data LAYB to a local data line in response to a second write enable signal BWEN2.

The write driver control unit 200 receives a write control signal BWEN, a driver select signal BAYBD, a bank flag signal BANK_FLAG and a write flag signal WR_FLAG to generate the first write enable signal BWEN1 and the second write enable signal BWEN2 so as not to activate the first write enable signal BWEN1 during a write command is not inputted.

FIG. 5 is a circuit diagram showing a write driver control unit 200 of the semiconductor memory device in FIG. 4.

As shown, the write driver control unit 200 includes an intermediate enable signal output unit 210, a first write enable signal output unit 220 and a second write enable signal output unit 230.

The intermediate enable signal output unit 210 combines the bank flag signal BANK_FLAG, the write flag signal WR_FLAG and the driver select signal BAYBD and outputs an intermediate enable signal EN. The bank flag signal BANK_FLAG enables a bank which performs the write operation. The write flag signal WR_FLAG is activated if the write command is inputted. The driver select signal BAYBD enables write drivers selected according to an X4 mode or an X8 mode. Herein, the X4 mode or the X8 mode is a number of data inputted or outputted once for the write operation or a read operation during the semiconductor memory device operates. In accordance with the embodiment of the present invention, the intermediate enable signal output unit 210 includes a first NAND gate IND1 which receives the bank flag signal BANK_FLAG, the write flag signal WR_FLAG and the driver select signal BAYBD to thereby output the intermediate enable signal EN.

The first write enable signal output unit 220 receives the intermediate enable signal EN outputted from the intermediate enable signal output unit 210 and the write control signal BWEN to generate the first write enable signal BWEN1. Also, in accordance with the embodiment of the present invention, the first write enable signal output unit 220 includes a NOR gate INOR1 which receives the intermediate enable signal EN and the write control signal BWEN to thereby output the first write enable signal BWEN1.

The second write enable signal output unit 230 generates the second write enable signal second write enable signal BWEN2 based on the driver select signal BAYBD and the write control signal BWEN. In accordance with the embodiment of the present invention, the second write enable signal output unit 230 includes a second NAND gate IND2 and an inverter IIV1. The second NAND gate IND2 performs a NAND operation based on the driver select signal BAYBD and the write control signal BWEN. The inverter IIV1 inverts an output of the second NAND gate IND2 to output the inverse signal as the second write enable signal BWEN2.

Figure 6:
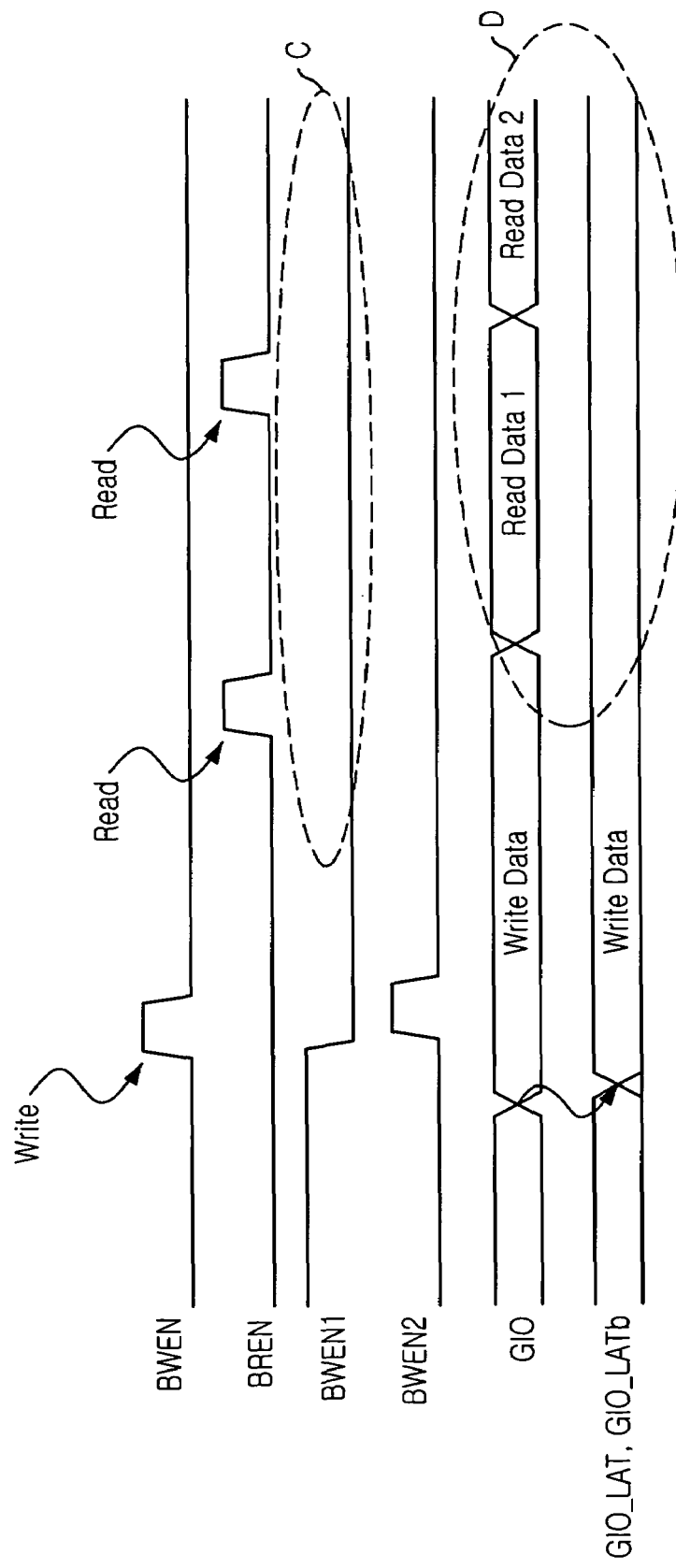
FIG. 6 is a timing diagram illustrating an operation of the semiconductor memory device of FIGS. 4 and 5.

FIG. 6 is a timing diagram illustrating an operation of the semiconductor memory device of FIGS. 4 and 5.

Hereinafter, referring to FIGS. 4 to 6, an operation of the semiconductor memory device will be explained in detail.

First, the intermediate enable signal output unit 210 of the write driver control unit 200 combines the bank flag signal BANK_FLAG, the write flag signal WR_FLAG and the driver select signal BAYBD. Then, the intermediate enable signal output unit 210 outputs the intermediate enable signal EN activated with a logic level 'LOW' when the bank flag signal BANK_FLAG, the write flag signal WR_FLAG and the driver select signal BAYBD are activated with a logic level 'HIGH'. Herein, the bank flag signal BANK_FLAG indicates which bank performs the write operation among the numbers of banks. The write flag signal WR_FLAG indicates whether the writer command is inputted or the read command is inputted. If the writer command is inputted, the write flag signal WR_FLAG is activated. Also, the driver select signal BAYBD is for designating the write driver among plural write drivers provided with the bank according to the X4 mode or the X8 mode.

As shown in FIG. 5, only when the bank flag signal BANK_FLAG, the write flag signal WR_FLAG and the driver select signal BAYBD are activated with the logic level 'HIGH', the intermediate enable signal EN is activated with the logic level 'LOW'. It means that the selected write driver of bank is substantially used for the write operation.

If the intermediate enable signal EN is activated, the first write enable signal output unit 220 of the write driver control unit 200 generates the first write enable signal BWEN1 by inverting the write control signal BWEN. According to the first write enable signal BWEN1, the global data latch unit 300 latches the global data GIO.

Also, the second write enable signal output unit 230 of the write driver control unit 200 generates the second write enable signal BWEN2 in response to the write control signal BWEN and the driver select signal BAYBD.

Accordingly, as shown in FIG. 6, the first write enable signal BWEN1 is activated only for a predetermined time of latching the global data GIO within a section which the write operation is performed. After the predetermined time, the first write enable signal BWEN1 maintains an inactivated state (see 'C').

Namely, during the read operation, the first write enable signal BWEN1 is inactivated so that a 'Read Data 1' or a 'Read Data 2' on the global data line are not latched by the global data latch unit 300.

As a result, the first global latch data GIO_LAT and the second global latch data GIO_LATB are not transferred to the local data write driving unit 400 because the global data latch unit 300 does not operate for a section when the write operation is not performed. Accordingly, the local data write driving unit 400 does not perform the unnecessary read operation (see 'D').

Figure 7:
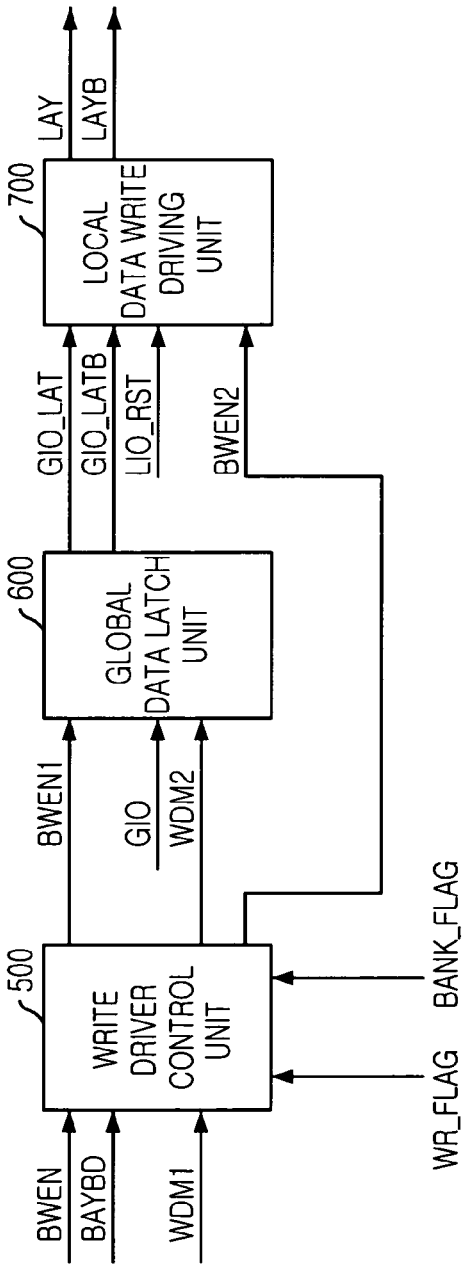
FIG. 7 is a block diagram describing a semiconductor memory device in accordance with another embodiment of the present invention.

FIG. 7 is a block diagram describing a semiconductor memory device in accordance with another embodiment of the present invention.

As shown, similar to FIG. 4, the semiconductor memory device includes a write driver control unit 500, a global data latch unit 600 and a local data write driving unit 700.

In accordance with another embodiment of the present invention, the write driver control unit 500 of the semiconductor memory device receives a write control signal BWEN, a driver select signal BAYBD, a bank flag signal BANK_FLAG, a write flag signal WR_FLAG and a first data mask signal WDM1. Consequently, the write driver control unit 500 generates a second first data mask signal WDM2 as well as a first write enable signal BWEN1 and a second write enable signal BWEN2. Herein, the first data mask signal WDM1 can stop a write operation during the semiconductor memory device performs the write operation based on a write command.

Figure 8:
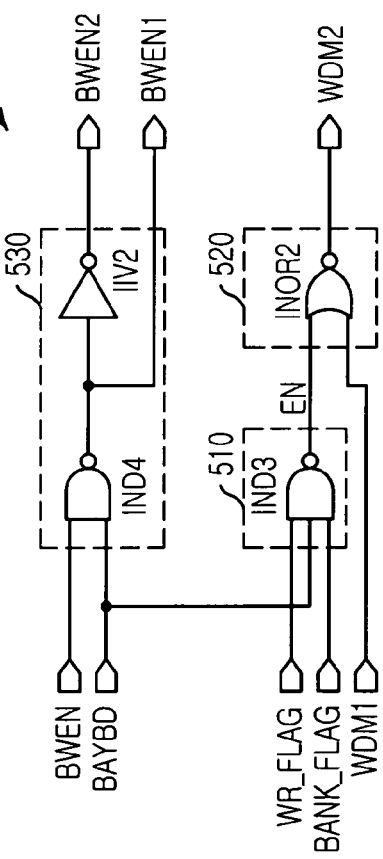
FIG. 8 is a circuit diagram showing a write driver control unit of the semiconductor memory device in FIG. 7.

FIG. 8 is a circuit diagram showing a write driver control unit of the semiconductor memory device in FIG. 7.

As shown, the write driver control unit 500 includes an intermediate enable signal output unit 510, a data mask signal output unit 520 and a write enable signal output unit 530.

The intermediate enable signal output unit 510 combines the bank flag signal BANK_FLAG, the write flag signal WR_FLAG and the driver select signal BAYBD to thereby generate an intermediate enable signal EN. Herein, the bank flag signal BANK_FLAG enables a bank which performs the write operation, the write flag signal WR_FLAG is activated if the write command is inputted and the driver select signal BAYBD activates a write driver selected according to an X8 mode or an X4 mode.

The data mask signal output unit 520 combines the intermediate enable signal EN outputted from the intermediate enable signal output unit 510 and the first data mask signal WDM1 to generate the second data mask signal WDM2 in order to stop the write operation.

The write enable signal output unit 530 combines the driver select signal BAYBD and the write control signal write control signal BWEN to generate a first write enable signal BWEN1 and a second write enable signal BWEN2.

The intermediate enable signal output unit 510 can include a third NAND gate IND3 which receives the bank flag signal BANK_FLAG, the write flag signal WR_FLAG and the driver select signal BAYBD to generate the intermediate enable signal EN.

The data mask signal output unit 520 can include a second NOR gate INOR2 which receives the intermediate enable signal EN and the first data mask signal WDM1 to generate the second data mask signal WDM2.

The write enable signal output unit 530 can include a fourth NAND gate IND4 and a second inverter IIV2. The fourth NAND gate IND4 receives the driver select signal BAYBD and the write control signal BWEN to output a result of the NAND operation as the first write enable signal BWEN1. The second inverter IIV2 inverts an output of the fourth NAND gate IND4 to output the second write enable signal BWEN2.

Referring to FIGS. 7 to 8, the global data latch unit 600 of the semiconductor memory device receives the second data mask signal WDM2 from the write driver control unit 500 so as to stop a latching operation when the second data mask signal WDM2 is activated.

Accordingly, a first global latch data GIO_LAT and a second global latch data GIO_LATB outputted from the global data latch unit 600 are not transferred to the local data write driving unit 700. Therefore, the local data write driving unit 700 does not need to perform the unnecessary read operation.

As above described, in the semiconductor memory device of the present invention, the global data latch unit does not operate for the section when the write operation is not performed so that there is not any unnecessary operation latching global data on the global data line according to the read command. Consequently, it is possible to reduce a current consumption used for performing an operation based on the write command or the read command.

In order words, during the read operation, it is possible to prevent a plurality of the global data latch units provided with each bank from operating unnecessarily. Also, during the global data latch unit provided with one bank latches the global data, the global data latch units provided with the order banks do not operate.

Moreover, numbers of the global data latch units used in the X4 or the X8 mode are ¼ or ½ less than numbers of the global data latch units used in the X16 mode. In this case, it is possible to reduce a current consumption by the global data latch unit.

The present application contains subject matter related to the Korean patent application No. KR 2005-58716, filed in the Korean Patent Office on Jun. 30, 2005, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. A semiconductor memory device for reducing a current consumption, comprising:
   a global data latch unit for latching a global data loaded on a global data line in response to a first write enable signal to thereby generate a global latch data;
   a local data write driving unit for receiving the global latch data to output a local data to a local data line in response to a second write enable signal; and
   a write driver control unit for generating the first write enable signal and the second write enable signal,
   wherein the first write enable signal is inactivated when a write operation is not performed,
   wherein the write driver control unit includes:
   an intermediate enable signal output unit for combining a bank flag signal to enable a bank for performing the write operation, a write flag signal activated if the write command is inputted, and a driver select signal for activating a selected write driver to generate an intermediate enable signal;
   a first write enable signal output unit for combining the intermediate enable signal and a write control signal for performing the write operation to generate the first write enable signal; and
   a second write enable signal output unit for combining the driver select signal and the write control signal to generate the second write enable signal.

2. The semiconductor memory device as recited in claim 1, wherein the intermediate enable signal output unit includes a NAND gate which receives the bank flag signal, the write flag signal and the driver select signal to generate the intermediate enable signal.

3. The semiconductor memory device as recited in claim 2, wherein the first write enable signal output unit includes a NOR gate which receives the intermediate enable signal and the write control signal to generate the first write enable signal.

4. The semiconductor memory device as recited in claim 1, wherein the second write enable signal output unit includes:
   a NAND gate for receiving the driver select signal and the write control signal; and an inverter for inverting an output of the NAND gate to output the second write enable signal.

5. The semiconductor memory device as recited in claim 1, wherein the write driver control unit includes:
   an intermediate enable signal output unit for combining a bank flag signal to enable a bank for performing a write operation, a write flag signal activated if the write command is inputted, and a driver select signal to activate a selected write driver to generate an intermediate enable signal;

a data mask signal output unit for combining the intermediate enable signal and a first data mask signal for stopping the write operation to generate a second data mask signal; and a write enable signal output unit for combining the driver select signal and the write control signal to generate the first write enable signal and the second write enable signal, wherein the global data latch unit stops a latching operation when the second data mask signal is activated.

6. The semiconductor memory device as recited in claim 5, wherein the intermediate enable signal output unit includes a NAND gate which receives the bank flag signal, the write flag signal and the driver select signal to generate the intermediate enable signal.

7. The semiconductor memory device as recited in claim 6, wherein the data mask signal output unit includes a NOR gate which receives the intermediate enable signal and the first data mask signal to generate the second data mask signal.

8. The device of claim 5, wherein the write enable signal output unit includes:

a NAND gate for receiving the driver select signal and the write control signal to output the first write enable signal; and an inverter for inverting an output of the NAND gate to output the second write enable signal.

9. A method for reducing a current consumption of the semiconductor memory device, comprising the steps of:

generating a first write enable signal and a second write enable signal;

latching a global data loaded on a global data line in response to the first write enable signal to generate a global latch data; and outputting a local data to a local data line based on the global latch data in response to the second write enable signal, wherein the first write enable signal is inactivated when a write operation is not performed;

wherein the step of generating the first write enable signal includes the step of:

generating an intermediate enable signal by combining a bank flag signal to enable a bank for performing the write operation, a write flag signal activated if the write command is inputted and a driver select signal for activating a selected write driver to generate an intermediate enable signal; and outputting the first write enable signal by combing the intermediate enable signal and a write control signal for performing the write operation.

10. The method as recited in claim 9, wherein, the intermediate enable signal is generated by a NAND operation of the bank flag signal, the write flag signal and the driver select signal.

11. The method as recited in claim 10, wherein, the first write enable signal is generated by a NOR operation of the intermediate enable signal and the write control signal.

12. The method as recited in claim 11, wherein the second write enable signal is generated by an AND operation of the driver select signal and the write control signal.

13. A semiconductor memory device, comprising:

a global data latch unit for latching a global data loaded on a global data line in response to a first write enable signal to thereby generate a global latch data;

a local data write driving unit for receiving the global latch data to output a local data to a local data line in response to a second write enable signal; and a write driver control unit for generating the first write enable signal and the second write enable signal, wherein the first write enable signal is activated only when a write operation is performed wherein the write driver control unit includes:

an intermediate enable signal output unit for combining a bank flag signal to enable a bank for performing the write operation, a write flag signal activated if the write command is inputted, and a driver select signal for activating a selected write driver to generate an intermediate enable signal;

a first write enable signal output unit for combining the intermediate enable signal and a write control signal for performing the write operation to generate the first write enable signal; and a second write enable signal output unit for combining the driver select signal and the write control signal to generate the second write enable signal.

* * * * *